(12) United States Patent
Tung

(10) Patent No.: US 6,809,418 B1
(45) Date of Patent: Oct. 26, 2004

(54) INTEGRATED CIRCUIT PACKAGE STRUCTURE

(76) Inventor: Kung-Chao Tung, No. 24, Chi E. St., Jungjeng Chiu, Taipei City (TW)

( * ) Notice: Subject to any disclaimer, the term of this patent is extended or adjusted under 35 U.S.C. 154(b) by 0 days.

(21) Appl. No.: 10/660,397

(22) Filed: Sep. 10, 2003

(51) Int. Cl.[7] ............................................. H01L 23/34
(52) U.S. Cl. ....................... 257/728; 257/658; 257/675; 257/678; 257/710; 257/712; 257/720; 257/727
(58) Field of Search ................................ 257/658, 675, 257/678, 704, 706, 707, 717–720, 726–728, 710, 712

(56) References Cited

U.S. PATENT DOCUMENTS

| | | | | |
|---|---|---|---|---|
| 4,925,024 A | * | 5/1990 | Ellenberger et al. | 174/52.4 |
| 5,315,153 A | * | 5/1994 | Nagai et al. | 257/701 |
| 5,426,405 A | * | 6/1995 | Miller et al. | 333/247 |
| 6,031,282 A | * | 2/2000 | Jones et al. | 257/692 |
| 6,049,127 A | * | 4/2000 | Yoo et al. | 257/728 |
| 6,265,774 B1 | * | 7/2001 | Sholley et al. | 257/728 |
| 6,476,463 B1 | * | 11/2002 | Kaneko et al. | 257/660 |
| 6,608,380 B2 | * | 8/2003 | Ro et al. | 257/712 |

* cited by examiner

Primary Examiner—Amir Zarabian
Assistant Examiner—Khanh Duong
(74) Attorney, Agent, or Firm—Alan D. Kamrath; Nikolai & Mersereau, P.A.

(57) ABSTRACT

A reliable new IC package structure comprises an IC package having a plurality fo grounding conductor plates provided around its surrounding, a first conductor plate for covering over the IC package has downwardly flexed edges at its both sides to form two lugs, and each grounding plate is upwardly camberred to wrap corresponding first conductor plates. A second conductor plate with similar shape to the first one for covering the former closely coupled first and grounding conductor plates, the both sides of the second conductor is also downwardly flexed to form two lugs. A press block having an inner cavity to shade the IC package, first and second conductor plates. Several elastic press bars are installed in said inner cavity and above grounding conductors. The press block, the second and the first conductor plates are engaged with screw to finish the assembly of the IC package of the best grounding effect, heat dissipation performance and quality associated with the additional merits of easy productivity and replaceabiltiy.

4 Claims, 2 Drawing Sheets

INTEGRATED CIRCUIT PACKAGE STRUCTURE

BACKGROUND OF THE INVENTION

1. Field of the invention

The present invention relates to an integrated circuit package structure, and more particularly, to a large power, high frequency integrated circuit package with excellent heat dissipation effect, and easy replaceability.

2. Description of the Prior Art

Being capacious to accommodate numerous components in a minimized space to greatly reduce size of the product, the integrated circuit package has played a important role in the progress of electronic technology.

To ensure reliable performance of a large power IC package to work at a high frequency, it must to have a good grounding effect. The good grounding effect can be achieved by a good conductivity, a large contact are with the grounding conductor, and short grounding passage.

To make a grounding passage as short as possible, the grounding wire of the IC package is conventionally directly weded to its circuit board. However, to ground an IC package in such way intending to achieve the purpose of minimizing the ground passage for a large power IC package working at a high frequency, for example, a sophisticated TI-Pack is absolutely inapplicable for reason that the grounding wire is inallowable to directly weled to the circuit board for the sake of heat dissipation problem. Meanwhile, there are extra problems of maintenance and component replacement to be considered.

In order to solve the above described problems, the present inventor carried out theoretical studies and simulating experiments, and based on these studies and researches, the present inventor came to propose the present invention.

SUMMARY OF THE INVENTION

Accordingly, it is an object of the present invention to provide a large power IC package workable at high frequency with good heat dissipation effect by enlarging the contact area with the grounding conductor of shortest passage so as to expel large grounding current thereby assuring the quality and durability of the IC package.

To be capable of facilitating flow of the grounding current, the bottom portion of the IC package is formed of a broad heat dissipation area associated with many fins.

It is another object of the present invention that this IC package is easy for assembly and convenient for component replacement so as to assure reliable performance.

For further understanding of the nature and objects of the present invention, reference should be made to the following detailed description taken in conjunction with the accompanying drawings provided below.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

Figure 1:
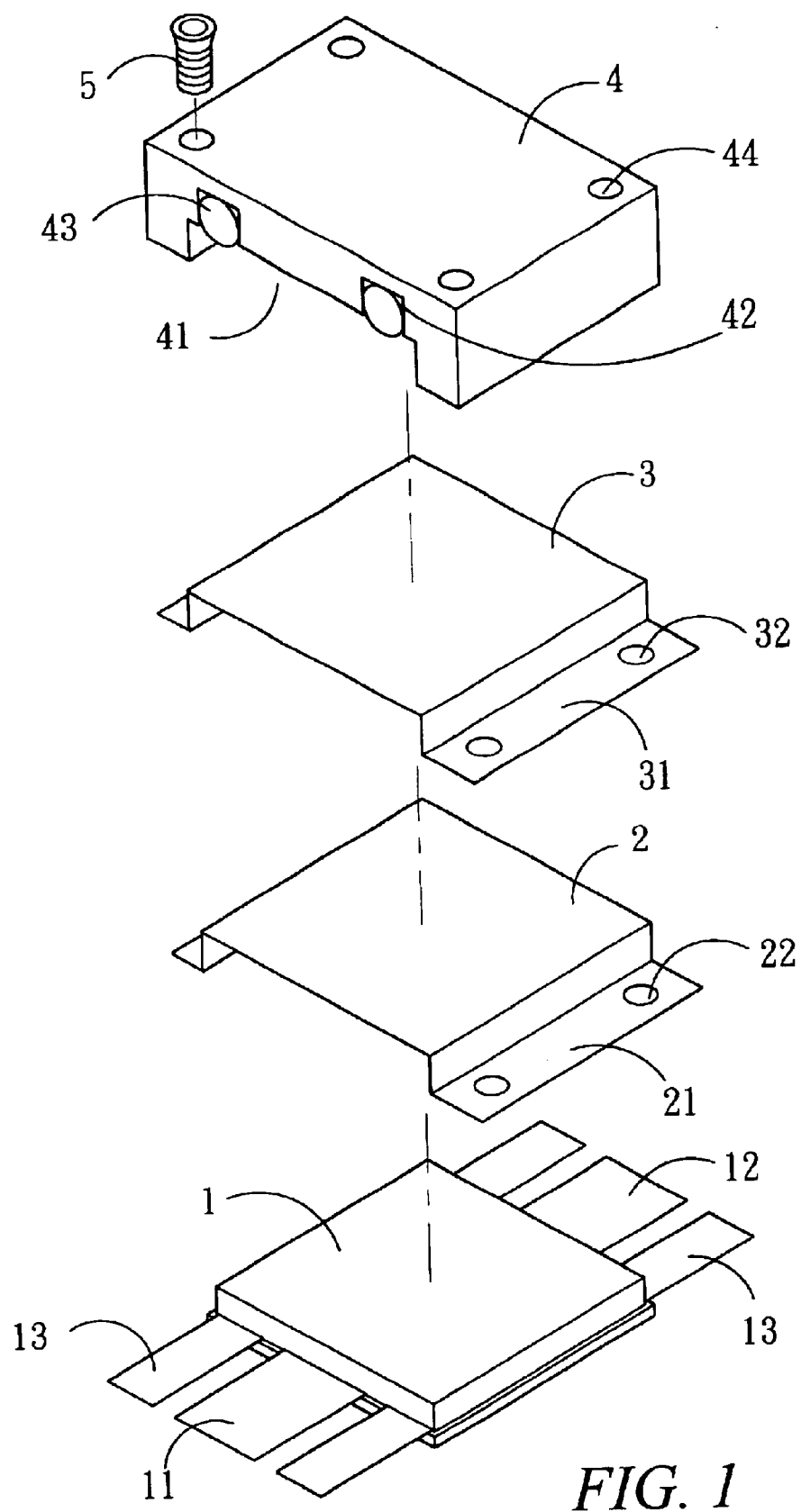
FIG. 1 is a perspective three dimensional exploded view of the IC package according to the present invention.
Figure 2:
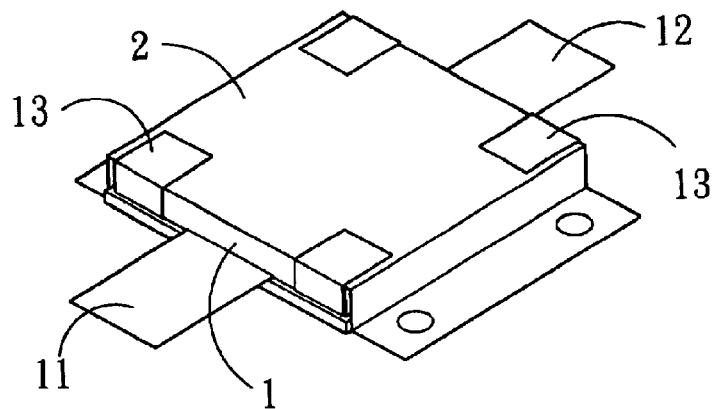
FIG. 2 is an schematic assembly view of the grounding plate with the first conductor plate according to the present invention.
Figure 3:
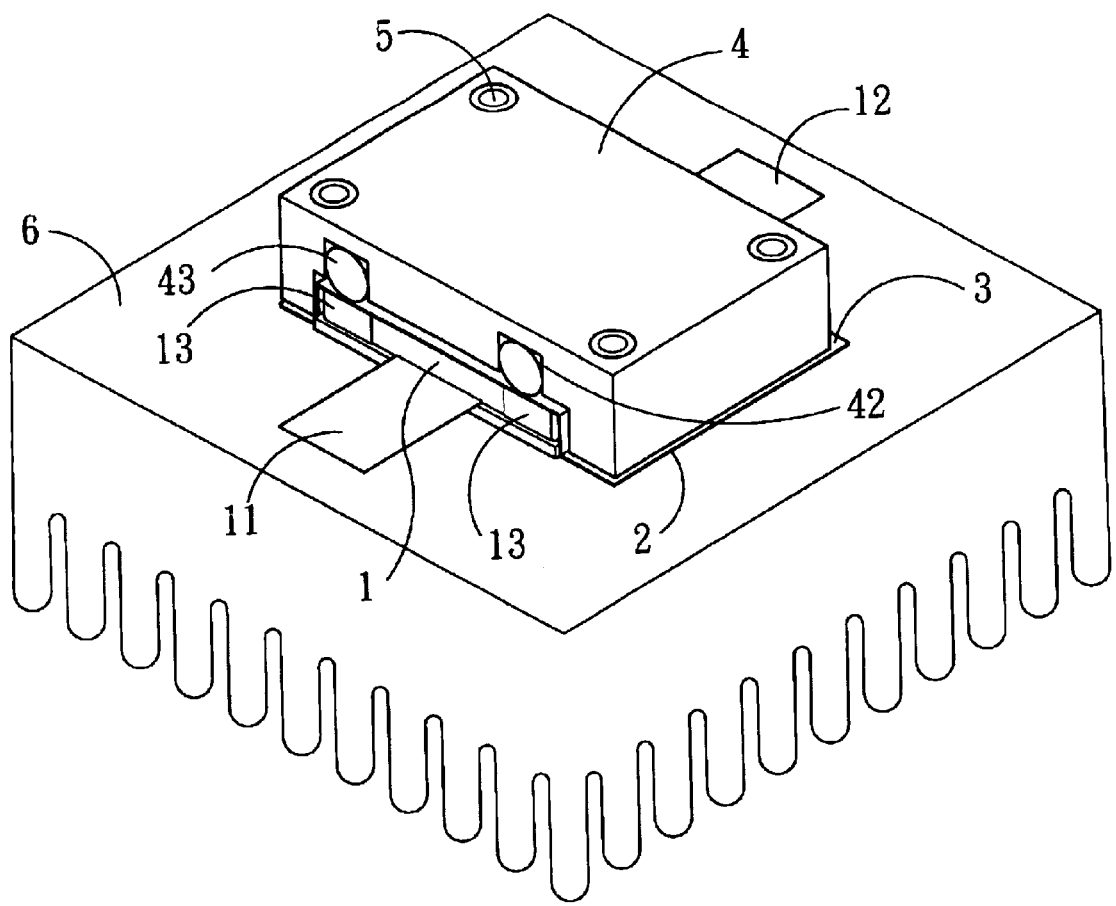
FIG. 3 is a perspective three dimensional assembly view of the IC package according to the present invention.

Referring to FIG. 1 through FIG. 3, the IC package structure is essentially composed of an IC package 1, a first conductor plate 2, a second conductor plate 3, and a press block 4. The IC package 1 has a signal input terminal 11 and a signal output terminal 12 respectively located at its front side and rear side thereof for conducting the functional signal current. A plurality of grounding plates 13 are provided at two sides of the path of the signal current which flow form the input terminal 11 to output terminal 12. The grounding plate 13 possesses a broad area and good conductivity sufficient to let through a large grounding current of the IC package 1.

The first conductor plate 21 covering over the IC package 1 has downwardly flexed edges at its both sides to or two lugs 21. The lug 21 has several screw fitting holes 22 for engaging with the IC package 1 appropriately by screws. On the contrary, the grounding plate 13 is upwardly cambered to wrap the first conductor plate 2 (see FIG. 2), and press forcibly onto the first conductor plate 2 to make the two conductor plates 13 and 2 perfectly in contact with each other. The second conductor plate 3 having a similar shape to the first conductor plate 2, is covering over the closely coupled first and grounding conductor plates 2 and 13 for further enhancing the fixing and grounding effects, and serving to increase the heat dissipation area. It should be noted that the two side edges of the second conductor plates 3 are also downwardly flexed to form two lugs 31. The lug 31 is also provided with several screw fitting holes 32. Here, the press block 4 is used to press the structure constructed as such. The press block 4 is configurated so as to have an inner cavity 41 to shade the assembled structure of IC package 1, the first and the second conductor plates 2 and 3. There are two slots 42 formed under the bottom of the press block 4 in the inner cavity 41 and which are parallel to the signal current passage and just located above the grounding conductor plate 13. Each slot 42 is fitted with an elastic bar 43 which is emerged downwardly to press the grounding conductor plate 13, the first and the second conductor plates 2 and 3 beneath. There are four corner screw fitting holes 44 provided for the press block 4 so as to engage the press block 4, the second and the first conductor plates 3 and 2 together with fixing screws 5 screwing into the holes 44, 32, and 22 therefore completing the assembly of the IC package 1.

It should be noted that there are the signal input and output terminals 11, 12 and four grounding conductor plates 13 are illustratively shown in FIG. 1, but this shall not be construed to be an exclusive structure for the IC package of the present invention. According to different requirement, the type of the IC package 1 can be changed, thus the amount and location of the above mentioned components are variable.

As described above, a conventional large power, high frequency sophisticated IC package such as a TI-Pack, an installation of a heat dissipation plate 6 is necessary to dissipated generated heat. In such a case, the grounding conductor must seek for a circuitous route to detour the heat dissipation plate 6 in order not to be affected by the heat generated from the IC package. On the contrary , the IC package of the present invention first uses the first conductor plate 2 to cover the IC package 1, and then the grounding conductor plate 13 of the IC package 1 is cambered upwardly so as to closely in contact with the first conductor plate 2, afterwards second conductor 3 and the press block 4 are overlapped thereon in order such that the elastic bar 43 fitted in the slots 42 of the press block 4 applys a pressure on the grounding conductor plate 13, the first conductor plate 2, and the second conductor plate 3 to forcibly conjoin them together, and in final stage, the aforesaid components are further engaged using the fixing screws 5. With this structure, the IC package structure of the present invention is characterized in possessing a large heat dissipation area and minimized course of the grounding conductor, besides, the effect of heat dissipation is further enhanced by forming tow layers of conductor plates 2 and 3. As a result, the IC package constructed according to the present invention achieves most optimistic heat dissipation effect.

In short, it emerges from the above description that the invention has several noteworthy advantages, in particular:

1. That the grounding effect, heat dissipation, performance and quality are the best of all equivalents.

2. The the easily assembled structure results in a low cost maintenance and components replacement.

Those who are skilled in the art will readily perceive how to modify the invention. Therefore, the appended claims are to be construed to cover all equivalent structures which fall within the true scope and spirit of the invention.

What is claimed is:

1. An IC package structure comprising:
   an IC package at least having a signal input terminal and a signal output terminal, and a plurality of grounding conductor plates being provided around its surrounding thereof;
   a first conductor plate for covering over said IC package and having downwardly flexed edges at its both sides to form two lugs, wherein each of said lug has several screw fitting holes, and each of said grounding conductor plate is upwardly cambered to wrapp said first conductor plate;
   a second conductor plate having a similar shape to said first conductor plate, for covering said closely coupled first and grounding conductor plates, wherein both sides of said second conductor plate are also downwardly flexed to form two lugs, each lug is provided with several fitting holes; and
   a press block configurated to have an inner cavity to shade said IC package, said first and said second conductor plates, wherein several elastic press bars are installed in said inner cavity of said press block and located above said grounding conductor plates, corner screw fitting holes are provided around the surrounding of said press block so as to engage said press block 4, said second and said first conductor plates together with fixing screws by screwing into said screw fitting holes thereby completing assembly of said IC package.

2. The IC package structure as in claim 1, wherein number of said grounding conductor plate is one or more.

3. The IC package structure as in claim 1, wherein said press block has several inner slots for said elastic press bars to fit into and emerge downwardly to press said grounding conductor plates, said first and said second conductor plates beneath.

4. The IC package structure as in claim 1, wherein said gounding conductor plate is engaged by welding for enhancing tightness.

* * * * *